United States Patent
Kamieniecki

(10) Patent No.: US 6,325,078 B2
(45) Date of Patent: Dec. 4, 2001

(54) APPARATUS AND METHOD FOR RAPID PHOTO-THERMAL SURFACE TREATMENT

(75) Inventor: Emil Kamieniecki, Lexington, MA (US)

(73) Assignee: QC Solutions, Inc.,, North Billerica, MA (US)

( * ) Notice: Subject to any disclaimer, the term of this patent is extended or adjusted under 35 U.S.C. 154(b) by 0 days.

(21) Appl. No.: 09/003,670

(22) Filed: Jan. 7, 1998

(51) Int. Cl.[7] ............................................. B08B 7/04
(52) U.S. Cl. ................... 134/1.3; 134/1; 134/18; 134/19; 134/902
(58) Field of Search ............... 134/1, 1.3, 2, 18, 134/19, 38, 39, 902; 438/906; 250/492.2

(56) References Cited

U.S. PATENT DOCUMENTS

| | | | |
|---|---|---|---|
| 4,544,887 | 10/1985 | Kamieniecki | 324/158 |
| 4,558,660 | * 12/1985 | Nishizawa et al. | |
| 4,581,578 | 4/1986 | Honma et al. | 324/158 |
| 4,599,558 | 7/1986 | Castellano, Jr. et al. | 324/158 |
| 4,871,417 | * 10/1989 | Nishizawa et al. | 134/1 X |
| 5,306,671 | 4/1994 | Ogawa et al. | |
| 5,453,702 | 9/1995 | Goldfarb | 324/765 |
| 5,470,799 | * 11/1995 | Itoh et al. | |
| 5,471,293 | 11/1995 | Lowell et al. | 356/30 |
| 5,661,408 | 8/1997 | Kamieniecki et al. | 324/765 |
| 5,663,657 | 9/1997 | Lagowski et al. | 324/766 |
| 5,716,495 | * 2/1998 | Butterbaugh et al. | 134/1 X |

FOREIGN PATENT DOCUMENTS

| | | |
|---|---|---|
| 41 22 587 | 1/1992 | (DE) . |
| WO 94/23854 | 10/1994 | (WO) . |

OTHER PUBLICATIONS

Akazawa et al., Photostimulated Evaporation of $SIO_2$ and $SI_3N_4$ Films by Synchrotron Radiation and its Application for Low–Temperature Cleaning of SI Surfaces, *Journal of Vacuum Science and Technology*. vol. 9, No. 5, Sep. 1, 1991, pp. 2653–2661.

* cited by examiner

Primary Examiner—Alexander Markoff
(74) Attorney, Agent, or Firm—Testa, Hurwitz & Thibeault, LLP

(57) ABSTRACT

An apparatus for surface treating a semiconductor wafer includes a surface treatment chamber and a source of radiation. The semiconductor wafer disposed inside the c amber is illuminated with radiation sufficient to create a plurality of electron-hole pairs near the surface of the wafer and to desorb ions and molecules adsorbed on the surface of the wafer.

15 Claims, 8 Drawing Sheets

APPARATUS AND METHOD FOR RAPID PHOTO-THERMAL SURFACE TREATMENT

FIELD OF THE INVENTION

The invention relates to an apparatus and method for processing a semiconductor, and more specifically, relates to an apparatus and method for surface treating a semiconductor wafer in preparation for an in-line monitoring procedure.

BACKGROUND OF THE INVENTION

Operation of an integrated circuit (IC) depends on the electrical propertie of materials of which the circuit is formed. Therefore, by monitoring selected electrical properties of these materials in the course of an IC fabrication, an effective control over the manufacturing process can be accomplished. Since modern ICs are typically formed in the shallow region below the surface of a semiconductor wafer, critical electrical properties are directly or indirectly related to the condition of the surface region of the semiconductor wafer. Surface properties of a semiconductor wafer can be monitored during IC fabrication through in-line monitoring procedures such as described in U.S. Pat. No. 4,544,887 and U.S. Pat. No. 5,661,408.

The in-line monitoring procedure permits surface properties of a semiconductor wafer to be measured without contacting the wafer surface, so that the surface properties are not affected by the measurement itself. However, unlike conventional methods of electrical characterization in which contaminant ions and molecules from the ambient environment do not significantly affect the measurements due to formation of a permanent contact on the surface of the wafer, non-contact measurements may not provide accurate information about the wafer. This is because contaminant ions and molecules from the ambient environment may adsorb on the surface of the wafer during transportation and storage, changing surface properties of the wafer. Consequently, it may be difficult to obtain accurate information about the surface properties of the semiconductors with the in-line monitoring procedures unless the semiconductors re surface treated prior to being measured.

According to one known method, a p-type silicon wafer is surface treated y being immersed in dilute hydrofluoric acid, rinsed with deionized water and dried in order to restore an inversion condition. A width of surface depletion layer measured under an inversion condition provides net doping concentration in the sub-surface region. Existing surface preparation steps, however, are typically not integrated with subsequent measurement steps. In addition, existing processing and monitoring methods are not capable of establishing the surface condition of a wafer by means of a simple treatment in ambient environment at atmospheric pressure as needed to carry out a specific electrical measurement.

Therefore, there is a need for an apparatus and method which determine selected electrical parameters of semiconductor wafers representing the outcome of individual processing steps, independent of the ambient atmosphere in which the wafers are stored or transported.

SUMMARY OF THE INVENTION

It is an object of the invention to provide a surface treatment apparatus and method, which reduce the affect of ambient environment, in which a wafer is transported or stored between processing steps, on the wafer surface condition. It is another object of the invention to provide a surface treatment apparatus and method which can be integrated with an in-line monitoring apparatus and method.

In one aspect, the invention features a method for in-line, real-time monitoring of a semiconductor wafer. According to the method, a plurality of electron-hole pairs are created near a surface of the wafer and the wafer is heated to substantially desorb any of a plurality of contaminant ions and molecules adsorbed on the surface of the wafer. In one embodiment, the plurality of electron-hole pairs are created by illuminating the wafer with a radiation of photon energy sufficient to create the plurality of electron-hole pairs. In another embodiment, the wafer is heated by illuminating the wafer with a near infrared radiation. In still another embodiment, the wafer is a p-type wafer and heating and illuminating the p-type wafer restores an inversion layer on the surface of the p-type wafer.

In another aspect, the invention features an apparatus for surface treating a semiconductor wafer. The apparatus includes a surface treatment chamber and a source of radiation, which illuminates a semiconductor wafer disposed inside the chamber with radiation sufficient to create a plurality of electron-hole pairs near a surface of the wafer and to desorb any of a plurality of ions and molecules adsorbed on the surface of the wafer. In one embodiment, the surface treatment chamber is integrated with an in-line, real-time testing apparatus such that a surface photovoltage of the wafer can be measured after the wafer has been surface treated. In another embodiment, the apparatus further comprises a power control circuitry for controlling an intensity of radiation from the radiation source.

BRIEF DESCRIPTION OF THE DRAWINGS

The invention is pointed out with particularity in the appended claims. The above and further advantages of this invention may be better understood by referring to the following description taken in conjunction with the accompanying drawings, in which:

DESCRIPTION OF THE PREFERRED EMBODIMENT

The surface condition of a semiconductor wafer depends on surface preparation as well as the wafer's surrounding ambient environment, which may be in gaseous, vapor, or liquid phase. In general, surfaces of semiconductor wafers tend to reach equilibrium with the surrounding ambient environment. Therefore, ions and molecules present in the ambient environment may adsorb to surfaces of the wafers exposed to the ambient environment, and changes in the ambient environment composition will also cause changes in the layer adsorbed to the surface. The effect of the gaseous ambient environment on the surfaces of wafers have been recognized and utilized by those skilled in the art, for example, as a means of varying the surface potential barrier height in germanium.

Figure 1:
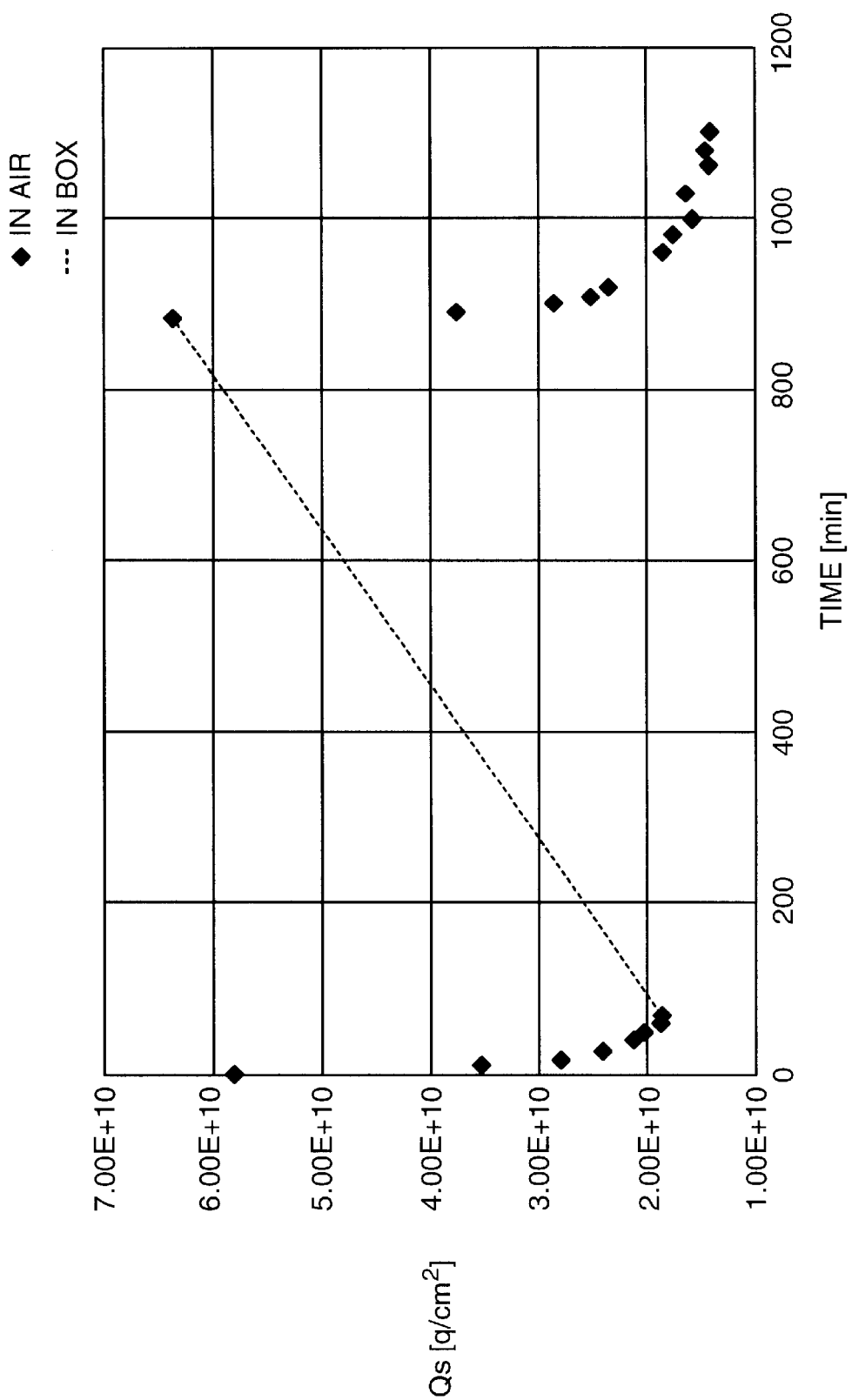
FIG. 1 is a graph illustrating time dependence of a surface charge measure on a p-type CZ silicon wafer sequentially exposed to clean room air, stored in a box and exposed again to clean room air.
Figure 2:
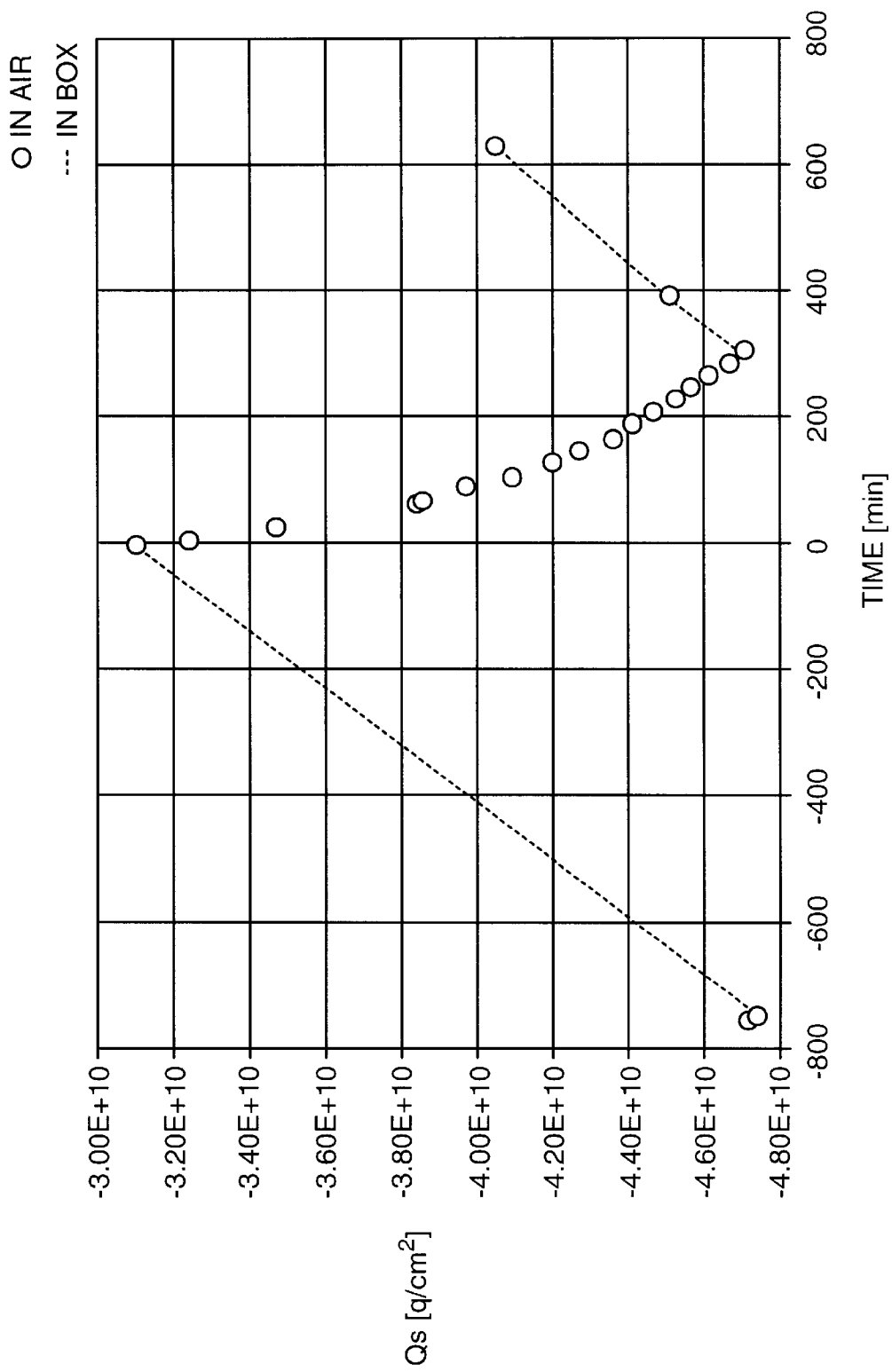
FIG. 2 is a graph illustrating time dependence of a surface charge measure on an n-type CZ silicon wafer sequentially stored in a box, exposed to clean room air, and again stored in a box.

Referring to FIGS. 1 and 2, the surface charge in silicon wafers varies a the ambient environment changes. FIG. 1 shows surface charge variation in a p-type wafer as a function of time and storage conditions. In FIG. 1, the p-type wafer is first exposed to a clean room air for approximately 70 minutes, stored in a covered box for approximately 800 minutes, and again exposed to the clean room air for approximately 225 minutes. The surface charge in the p-type after is measured using the surface photo-voltage method as described in U.S. Pat. No. 4,544,887 issued on Oct. 1, 1985 and U.S. Pat. No. 5,661,408 issued on Aug. 26, 1997, both assigned to the assignee of the present invention. FIG. 2 similarly shows surface charge variation in an n-type wafer. In FIG. 2, the n-type wafer is sequentially stored in a box for approximately 740 minutes, exposed to clean air for approximately 300 minutes, and again stored in a box for approximately 300 minutes. The surface charge of the n-type wafer is also derived from surface photo voltage measurements. The surface charge measurements shown in FIGS. 1 and 2 demonstrate the sensitivity of the silicon surface charge to the clean-room a d the storage container ambient environment conditions. While the magnitude of the surface charge variations for p-type and n-type wafers as shown in FIGS. 1 and 2 differs, the polarity of the changes is the same, independent of the conductivity type of the wafer. Exposure to clean-room air results in more negative surface charges and storage in the container results in more positive charges forming at the wafer surface. The difference in the polarity of the surface charge changes can be attributed to the difference in the composition of the clean-room and the box ambient environments. It has been observed by the inventor that the rate of change in the surface charge depends on the surface preparation, and composition of water-based cleaning solutions used in cleaning the wafers.

FIGS. 3 (a–e) show an evolution of the contamination of a silicon wafer surface due to its interaction with a surrounding environment. A crystalline silicon wafer (FIG. 3a) has a positive charge 10 associated with the lack of bonds to atoms at the wafer surface as symbolically illustrated in FIG. 3a. However, such an abruptly terminated surface is inherently unstable, and other species from the surrounding ambient environment will adsorb on the surface of the wafer 12. The atoms in a few top monolayers of the silicon crystal may also rearrange their configuration resulting in a more gradual transition from the surface to the bulk crystalline structure. In this case, the positive charge associated with the crystal termination will be distributed across a few top monolayers.

Figure 3A:
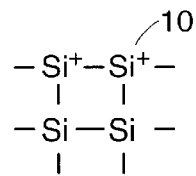
FIGS. 3a–e illustrate adsorption of contaminant ions and molecules from the ambient environment on a surface of a semiconductor wafer and desorption of the contaminations and molecules from the wafer surface through a subsequent photo-thermal treatment of the invention.
Figure 3B:
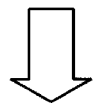
Figure 3B:
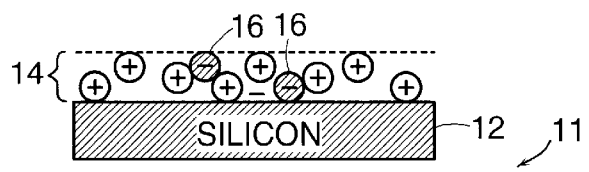

The stability of such bare silicon surface will depend on its prior history. However, given enough time, the exposure of the silicon surface to the surrounding environment will result in the formation of a thin native oxide layer 14 as illustrated in (FIG. 3b). Similarly, a thin chemical oxide film could be formed on the silicon wafer surface 12 when the wafer is subjected to a cleaning procedure, such as an RCA clean. The positive charge at a wafer surface associated with crystal termination will spread into the oxide in both cases. However, as illustrated in FIG. 3b, negative ions 16 from the ambient environment can interact with the wafer surface 12 during or before oxide formation. These interactions with negative ions 16 from the ambient environment may result in adsorption of these species to the surface of the wafer 12 with the resulting contamination of the native or chemical oxide layer 14. Negative ions 16 from the ambient environment reduce positive oxide charge. Examples of such contaminants, in the case of the RCA clean, are aluminum and iron.

Figure 3C:
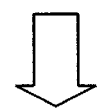
Figure 3C:
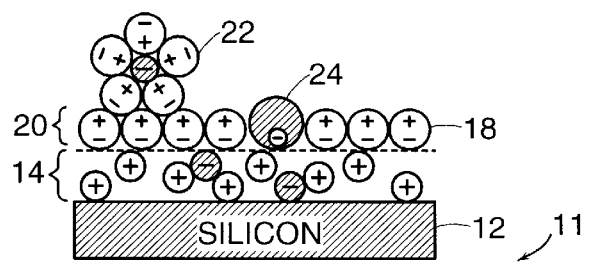
Figure 4:
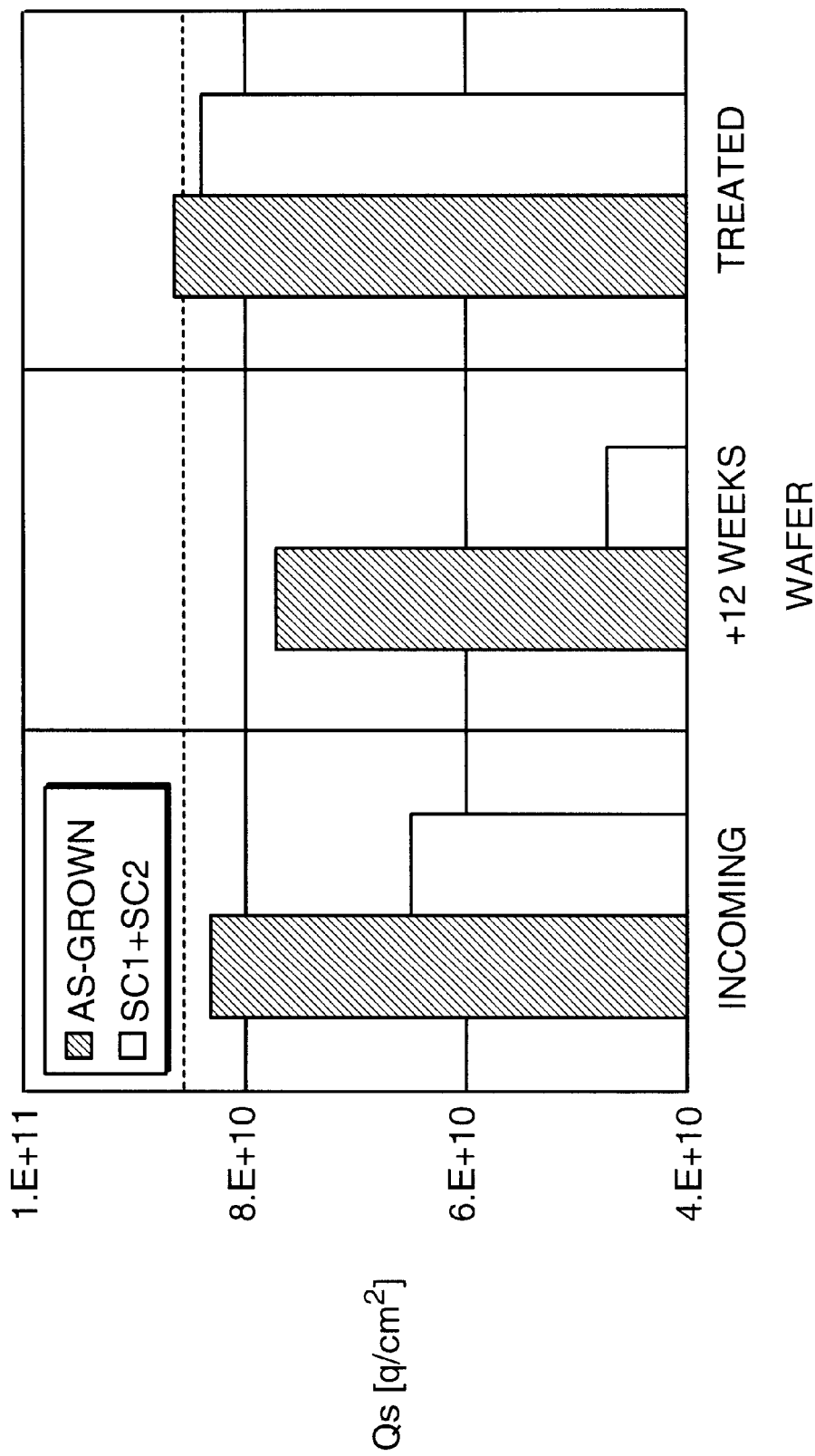
FIG. 4 is a graph comparing the surface charges of two p-type silicon wafers grown in the same batch, one as-grown and the other RCA cleaned (SC1+SC2), immediate r fabrication, after storage for 12 weeks, and after photo-thermal treatment.

Neutral polar molecules 18 from the liquid ambient environment (e.g., water or alcohol) may adsorb on the oxide layer 14 of the wafer surface 12, resulting in formation of a double-layer as shown in FIG. 3c. The double-layer 20 can also result from adsorption of polar molecules 18 from the air (FIG. 3c). The double layer may also contain some negative ions and species 22, 24, again reducing positive charge at the surface of the wafer. It can be expect that the transition from the virgin surface (shown in FIG. 3a) to a double-layer 20 coated surface (FIG. 3c) will take longer than transition from the oxidized surface 14 (FIG. 3b) to the double layer 20 coated surface FIG. 3c. This principle is illustrated in FIG. 4, which compares evolution of two p-type silicon epitaxial wafers grown in the same batch, during storage and after photo-thermal surface treatment. One wafer, labeled as "as-grown", was not subject to any cleaning, while the other wafer, labeled "SC1+SC2", was subject to an oxidizing clean. The graph in FIG. 4 shows that the surface charge of the two wafers immediately after removal from the shipping containers is already substantially different, and both deviate from the target surface charge represented by a dash line. The RCA-treated wafer shows less positive charge than the as-grown wafer. The difference between the wafers increase even more after the wafers are stored in a container for further 12-weeks, illustrating that charge variation in RCA-treated wafer occurs faster than in a non-treated wafer. The graph in FIG. 4 also shows that photo-thermal surface treatment of the present invention restore the positive surface charge on both wafers approximately to the target value.

Figure 3D:
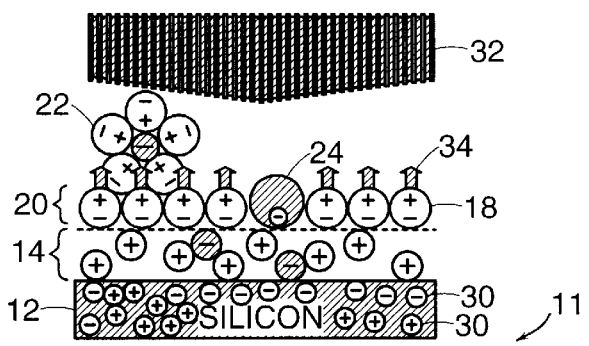
Figure 3E:
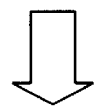
Figure 3E:
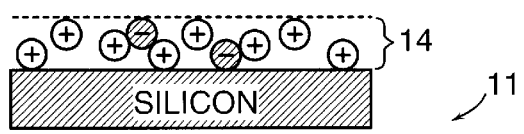

Referring to FIG. 3d, the present invention features a photo-thermal surface treatment method and an apparatus for removing or neutralizing surface charges associated with the double layer 20. According to the invention, a plurality of electron-hole pairs 30 are created near the surface of the wafer 12 by illuminating the wafer. Creation of the electron-hole pairs 30 weakens the strength with which non-volatile ions and molecules of the double layer 20 are adsorbed to the oxide layer 14. The wafer is also heated to substantially desorb volatile contaminant ions and molecules adsorbed on the surface of the wafer 12. As the volatile contaminant ions and molecules, including polar molecules 18 forming a double layer 20 desorb, they carry away the non-volatile contaminant ions and molecules 22, 24 as well. Therefore, after photo-thermal surface treatment, the surface charge properties of the wafer is returned to its state prior to formation of the double layer 20 as shown in FIG. 3e.

In the case of p-type silicon wafers, the positive surface charge induces an inversion condition at the surface by repelling positively charged free holes from the surface region. Therefore, the photo-thermal surface treatment restoring the positive surface charge will also restore inversion conditions at the surface. This allows the establishment of reference conditions at the semiconductor surface for the measurement of the basic electrical parameters such as doping concentration and surface recombination lifetime. The photo-thermal surface treatment of p-type silicon wafers may also allow activating of dopants such as boron, which were deactivated due to interaction with hydrogen or metal atoms.

The invention makes use of optical radiation 32 (FIG. 3d) under defined conditions to remove species adsorbed on the surface 12 of a semiconductor wafer 11 due to interaction with an ambient environment. In this method, a uniform beam of light 32 is directed at the surface 12 of the semiconductor wafer 11, illuminating the wafer 11. The illuminating light 2 comprises a combination of short and long wavelength light. The short wavelength light has wavelengths greater than that corresponding to the energy gap of the semiconductor material. The long wavelength light has wavelength in the near infrared range. The light with the wavelength greater than the band gap generates a high density of free electrons and holes 30 (FIG. 3c) near the semiconductor surface 12 and heats the wafer 11. The light in the near infrared range further increases the temperature of the semiconductor surface 12 to that required to desorb or evaporate volatile molecular species adsorbed on the surface 12. As the volatile species desorb, they carry away other, non-volatile ions and molecules adsorbed to the surface 12 of the wafer 11.

The effect of photo-thermal surface treatment of a wafer can be monitored by measuring the AC surface photovoltage of the wafer under conditions disclosed in U.S. Pat. No. 4,544,887 and U.S. Pat. No. 5,661,408. The conditions of the wafer treatment, temperature and illumination time are determined based on these measurements.

Figure 5:
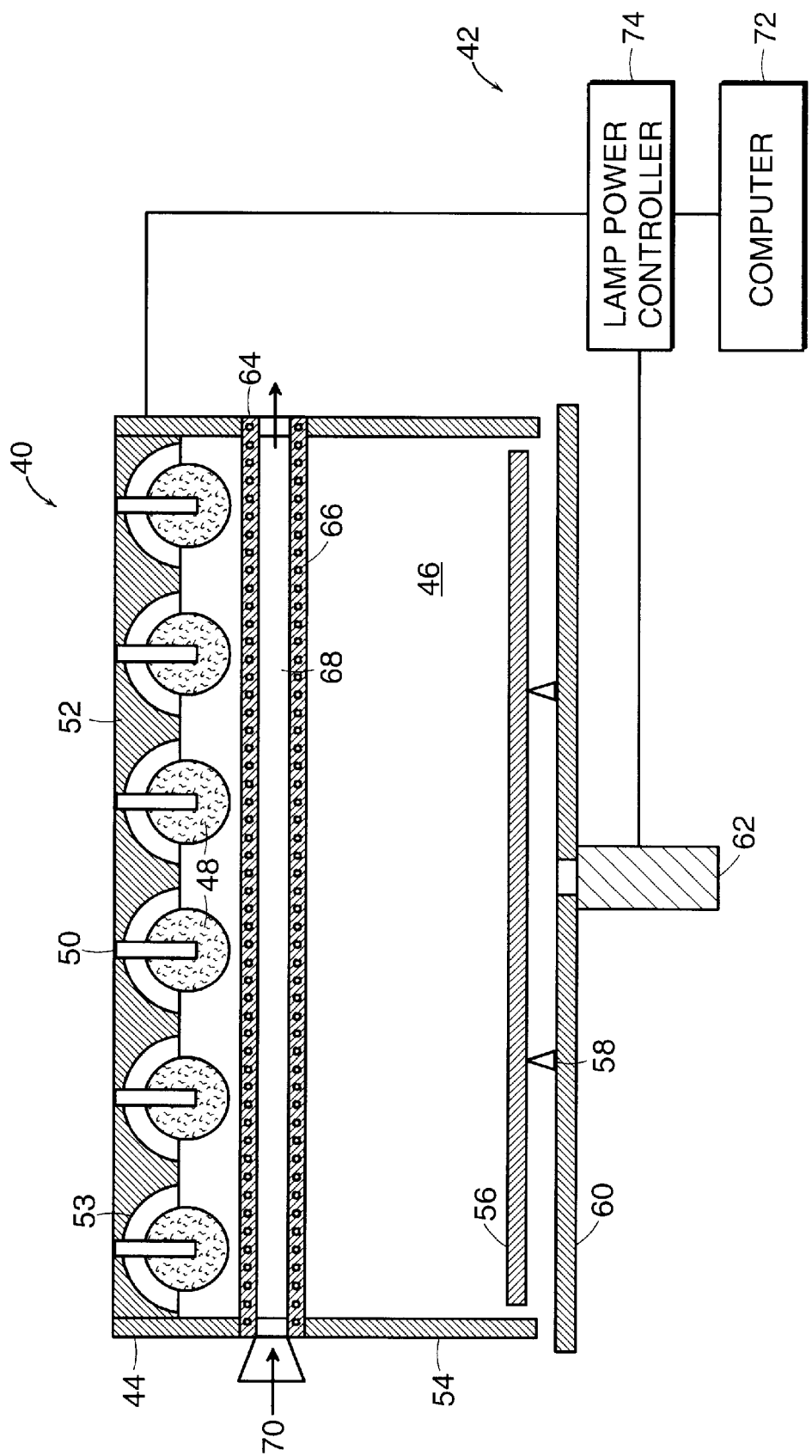
FIG. 5 is a schematic diagram of an embodiment of an apparatus of the invention for photo-thermal surface treatment of a semiconductor wafer.

Referring to FIG. 5, an apparatus for photo-thermal surface treatment includes two major parts: a wafer-processing module 40 and a power control circuitry 42. The wave-processing module 40 includes a light source unit 44 integrated with the wafer processing chamber 46. The light source unit 44 is capable of generating light having wavelengths sufficient to generate free electron-hole pairs near the surface of the wafer and near infrared light. In the embodiment of FIG. 5, the light is provided by tungsten halogen quartz lamps 48. The lamps 48 provide the light in the spectral range from about 0.2 $\mu$m to about 4 $\mu$m. The lamps 48 are mount to a water-cooled top light reflector 52 with ceramic lamp supports 50. In an alternative embodiment, a hot plate or a furnace is used to heat the wafer, while the light source provides the short wavelengths light. The wafer is heated to a temperature in the range from about 200° C. to abut 300° C. The top light reflector 52 includes a series of parabolic reflectors 53 which provide uniform illumination over the entire wafer located in the processing chamber 46.

In one embodiment, the light source 44 may comprise 10 tubular quartz halogen lamps of 1000 Watts each. In this embodiment, the distance between the lamps may be approximately 20 mm. To compensate for the decrease in light intensity at the periphery of the illuminated area, the water-cooled side reflectors 54 are added on all four sides of the process chamber 46. Alternatively, these four side reflectors 54 may be replaced by a cylindrical reflector with a diameter slightly exceeding the diameter of the wafer 56. The diameter of the cylindrical reflector, for example, may exceed the diameter of the wafer 56 by about 20 mm. The side reflectors 54 extend below the plane of wafer 56, when the wafer 56 is disposed on a wafer support 58 in the process chamber 46.

The apparatus further includes a water-cooled bottom light reflector 60 under the wafer 56 to improve the uniformity of the light. In one embodiment, the wafer 56 is supported by three thermally insulating pins 58 manufactured from Vespel® provided by DuPont Company (Wilmington, Del.) arranged in a triangular configuration. The top, side and bottom light reflectors 52, 54, 60 form a "black-body" box, uniformly illuminating the chamber 46 due to multiple scattering. Light uniformity in the embodiment of FIG. 5 has been measured. At the distance of about 100 mm below the lamps 48, the light uniformity was ±5% across an area 200 mm in diameter. The distance of 100 mm below the lamps 48 corresponds to wafer location.

In the embodiment of FIG. 5, the power control circuitry 42 is in communication with the wafer-processing module 40 in a closed-loop. The intensity of light illuminating the wafer 56 is controlled by measuring radiation from the wafer 56 with an infrared sensor 62 located beneath the wafer 56. In one detailed embodiment, the sensor 62 is located about 25 mm beneath the wafer 56. The radiation information is used to control the intensity of light illuminating the wafer 56.

The infrared sensor 62 is sensitive only to the radiation of wavelengths between 6.5 $\mu$m and 14 $\mu$m, and therefore, measures radiation emitted by the wafer 56 and not the light source 44. The signal from the infrared sensor 62 is fed into a lamp power controller 74 which controls power supplied to the lamps 48, and hence controls intensity of the light illuminating the wafer 56. The controller 74 is programmed manually or via a connection to a computer 72 for the wafer 56 to reach a predetermined temperature and then to maintain this temperature for a predetermined time.

To provide accurate measurement of the wafer temperature, the wafer-processing module 40 further includes a set of optical filters 64, 66 made of quartz. The set of optical filters 64, 66 filters infrared radiation from the lamps 48 exceeding wavelength of approximately 4 $\mu$m, such that the temperature detected by the sensor 62 results from the wafer radiation only. The first quartz filter 64 absorbs light having wavelength exceeding about 4 $\mu$m. The absorption of light causes this filter 64 to warm up and to emit infrared radiation of wavelengths longer than 4 $\mu$m. This radiation is subsequently absorbed by the second quartz filter 66. The quart filters 64, 66 are cooled down by air passing through a passageway 68 between the filters 64, 6. In one embodiment, an electrical fan forces air through the inlet 70 of the passageway 68.

The light source 44, in combination with the filters 64, 66 produce light having wavelengths of less than about 4 $\mu$m. This light illuminating the wafer 56 is capable of generating free electron-hole pairs near the surface of the wafer and heating the wafer to a temperature sufficient to desorb contaminant ions and molecules. The radiation emitted by the heated wafer 56 is measured using the infrared sensor 62.

After completion of the illumination cycle, the power applied to the lamp 48 is turned off and the wafer 56 is left to cool down to a room temperature. Alternatively, the three wafer support pins 58 can be retracted causing the wafer 56 to get in a close proximity or touch the water cooled bottom reflector 60 to speed up the wafer cooling process. During the cooling process, the temperature of the wafer 56 is again monitored by the infrared sensor 62. Once the wafer 56 is cooled to a temperature close to a room temperature (within about 5° C.), the wafer 56 is moved from the cooling station back to the cassette or to the surface measuring station.

A benefit of the photo-thermal surface treatment apparatus is that the surface treatment apparatus may be integrated with an in-line, real-time testing apparatus, such that electric characteristics of the surface treated wafers can be measured. For example, AC photovoltage induced at the surface of the wafers can be measured and analyzed.

Figure 6:
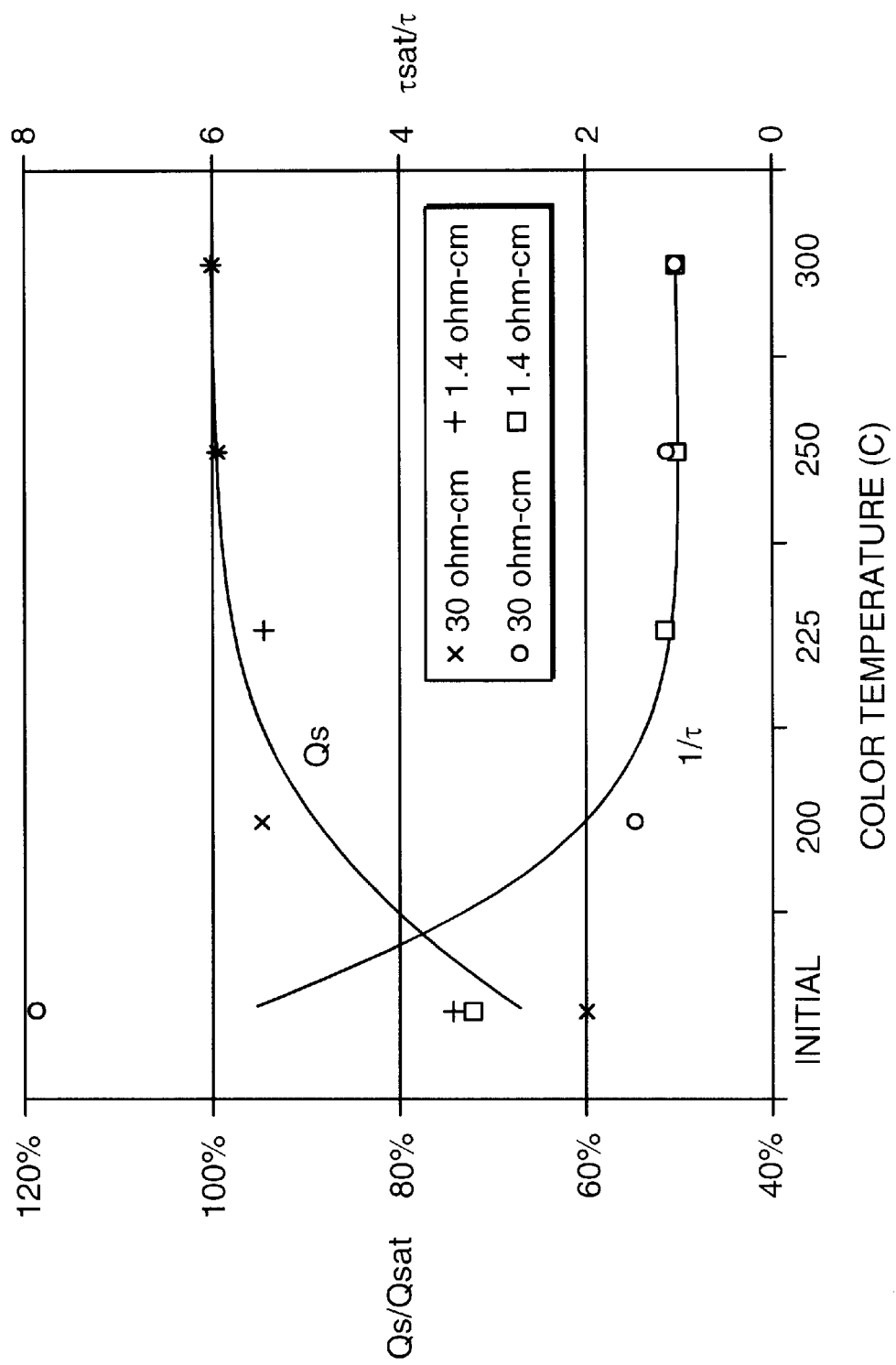
FIG. 6 is a graph illustrating dependence of electrical characteristics of two p/p+ silicon epitaxial wafers on peak temperature during photo-thermal treatment at constant processing time of 30 seconds.

Electrical characteristics of p-type wafers, photo-thermal surface treated a various temperatures, have been measured. AC photovoltage induced at the surface of the wafers have been measured and analyzed with a method described in U.S. Pat. No. 4,544,887 and U.S. Pat. No. 5,661,408. Carrier lifetime, doping concentrations, conductivity type and depletion width have been determined from the surface photovoltage measurements. Referring to FIG. 6, electrical characteristics of p-type epitaxial layers depend on the maximum or peak temperature reached by the wafer during the illumination cycle. In the embodiment of FIG. 6, the time required to reach the peak temperature during treatment was about 30 seconds. Immediately after reaching the peak temperature, the illumination was turned off and the wafer was permitted to cool. Wafers were measured at room temperature after each heating-cooling cycle.

The surface charge, $Q_s[q/cm^2]$, and the reciprocal of the surface recombination lifetime, $1/\tau[1/\mu sec]$, were measured for two p/p+ silicon epitaxial wafers with epitaxial layer resistivities of 1.4 ohm-cm and 30 ohm-cm, respectively. The surface charge of the wafers increased after each heating-cooling cycle, reversing the change in surface charge due to exposure to the clean-room air for about 2 hours. With further increase in temperature, the surface charge reached its saturation value corresponding to the surface inversion. Similarly, the reciprocal of the surface recombination lifetime changed with the processing conditions, reaching saturation at about the same temperature as the surface charge. The same dependence on processing conditions was observed independent of the resistivity of the wafer and wafer cleaning. This is demonstrated in FIG. 4, which shows two epitaxial wafers, one as-grown and one SC1+SC2 treated, both reaching about the same target value after photo-thermal treatment. For temperatures exceeding the temperature at which the surface charge and the reciprocal of the surface recombination lifetime reached the saturation value, further illumination beyond the time required to reach a peak temperature did not affect the measurements. At lower temperatures, the measured values increased slightly with increased illumination time.

In general, processing conditions required to reach saturation depends on wafer parameters. They depend, for instance, on the wafer diameter and thickness. They may be different for CZ and epitaxial wafers. A wafer coating (e.g., thermal oxide coating) is also expected to change treatment conditions.

Photo-thermal treatment restores positive surface charge and inversion conditions, which allows the establishment of reference conditions for determining specific parameters of the wafers. Two important parameters include near surface doping concentration, $N_{SC}$, and surface recombination lifetime, $\tau$. These parameters can be determined from the measurement of the AC surface photovoltage performed under conditions as described in U.S. Pat. No. 4,544,887 and U.S. Pat. No. 5,661,408.

Figure 7:
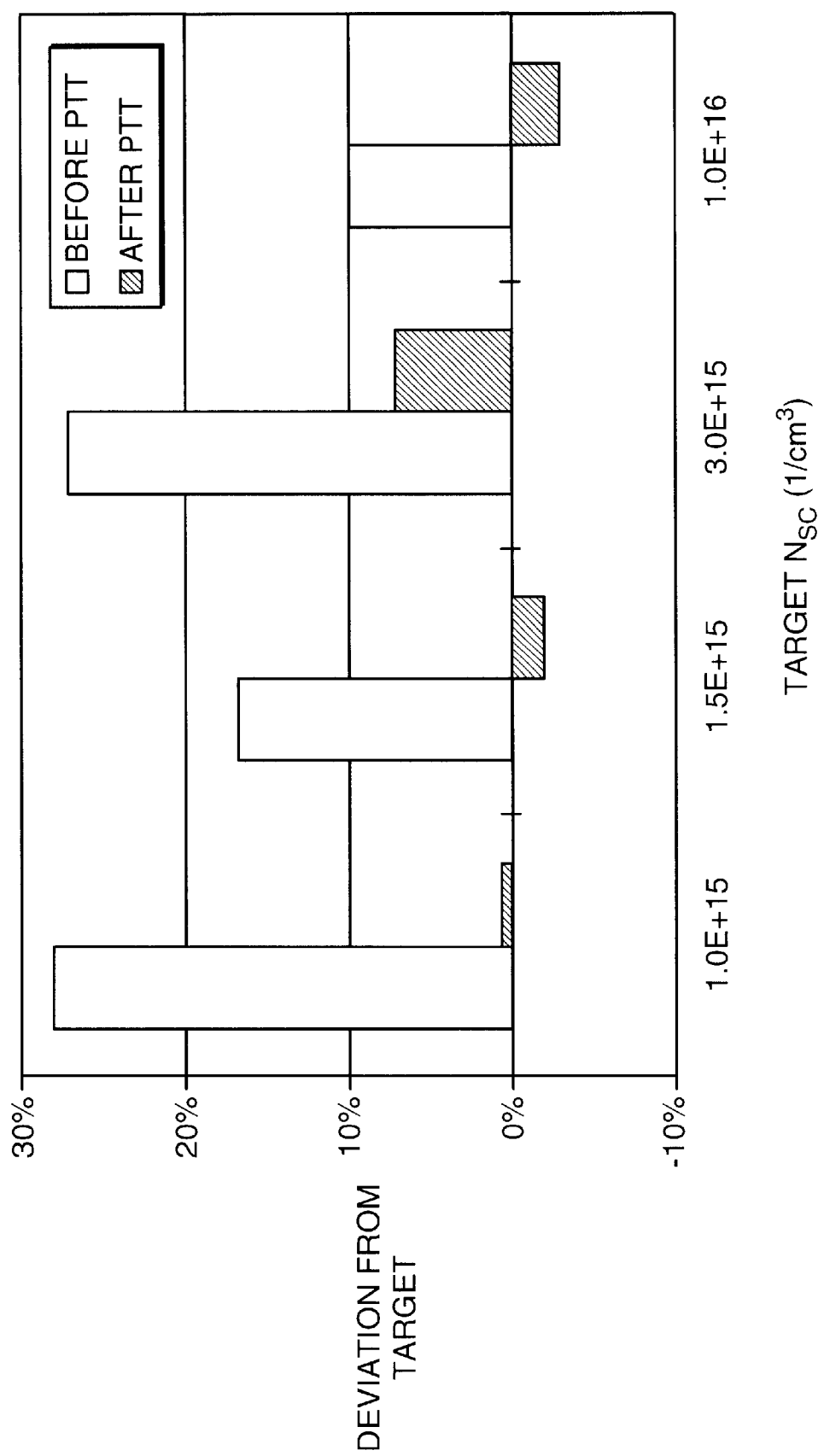
FIG. 7 is a graph comparing deviations of the apparent doping concentration measured in as-grown p-type silicon wafers before and after photo-thermal treatment at peak temperature of 250° C.

Referring to FIG. 7, the apparent doping concentrations of as-grown p-type silicon epitaxial wafers before and after photo-thermal treatment at peak temperature 250° C. are compared. The abbreviation PTT refers to photo-thermal treatment. The doping concentrations were measured with an assumption that each wafer surface was at inversion. For all measured wafers, the apparent doping concentrations deviated from a target value more before photo-thermal treatment then after the treatment. The values after surface treatment were within expected wafer batch uniformity.

Figure 8:
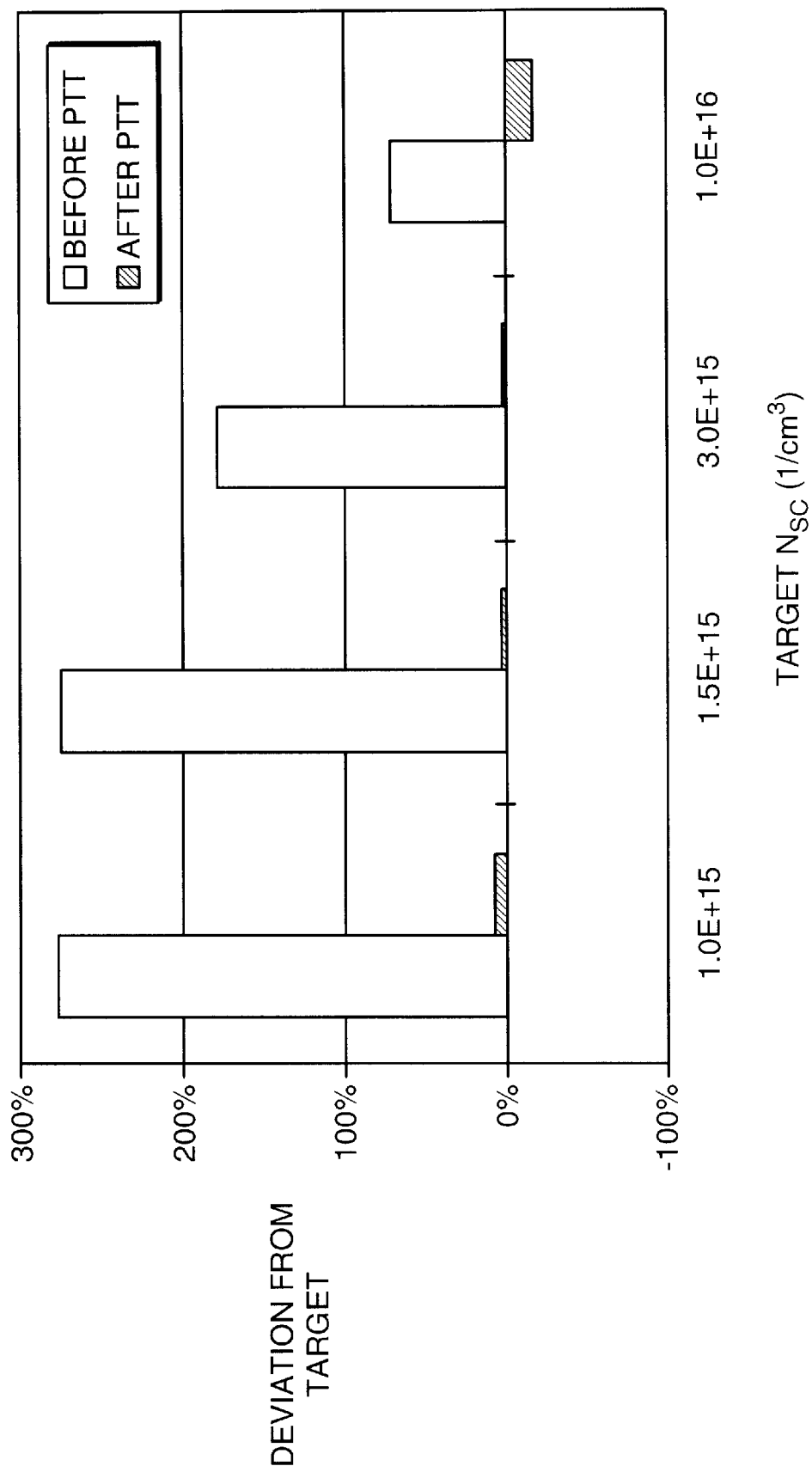
FIG. 8 is a graph comparing deviations of the apparent doping concentration measured in RCA cleaned p-type silicon wafers before and after photo-thermal treatment at peak temperature of 250° C.

Referring to FIG. 8, doping concentrations of RCA cleaned p-type silicon epitaxial wafers are compared before and after photo-thermal treatment at peak temperature of 250° C. The measurement conditions were the same as for the wafers of FIG. 7. The measured doping concentrations deviated from a target value more before photo-thermal treatment then after. The deviation before photo-thermal treatment was about an order of magnitude higher than for the RCA cleaned epitaxial wafers than for the as grown wafers shown in FIG. 7.

Having shown the preferred embodiment, those skilled in the art will realize many variations are possible, which will still be within the scope and spirit of the claimed invention. Therefore, it is the intention of the applicant to limit the invention only as indicated by the scope of the following claims.

What is claimed is:

1. A method for in line, real-time processing of a semiconductor wafer comprising:

creating a plurality of electron-hole pairs near a surface of the wafer; and heating the wafer under ambient pressure and atmosphere to substantially desorb any contaminant from an ambient environment adsorbed on the surface of the wafer by illuminating the wafer with radiation having wavelengths in a near infrared range.

2. The method of claim 1 wherein creating a plurality of electron-hole pairs comprises illuminating the wafer with radiation having a wavelength sufficient to create a plurality of electron-hole pairs near the surface of the wafer at a concentration sufficient to substantially desorb the contaminant.

3. The method of claim 2 further comprising automatically controlling intensity and duration of heating and illuminating steps.

4. The method of claim 2 further comprising measuring a temperature of the wafer during the heating step and controlling intensity and duration of heating and illuminating steps based on the measured temperature.

5. The method of claim 2 wherein the wafer is heated and illuminated until an unstable surface of the wafer is stabilized.

6. The method of claim 1 wherein heating comprises heating the substrate to a temperature in the range from about 200° C. to about 300° C.

7. The method of claim 2 further comprising cooling the wafer after heating and illuminating the wafer.

8. The method of claim 2 wherein the wafer is a p-type wafer and heating and illuminating the wafer restores an inversion layer at the surface of the p-type wafer.

9. The method of claim 2 wherein the wafer is a p-type wafer and heating and illuminating the wafer activates dopants previously deactivated due to interactions with contaminant ions.

10. A method for in line, real-time processing of a semiconductor wafer comprising:

creating an inversion condition at a surface of the wafer by:

illuminating the wafer with radiation having a wavelength sufficient to create a plurality of electron-hole pairs near a surface of the wafer; and heating the wafer under ambient pressure and atmosphere to substantially desorb any contaminant from an ambient environment adsorbed on the surface of the wafer; and measuring an electrical characteristic of the wafer.

11. The method of claim 10 wherein measuring an electrical characteristic comprises measuring a photovoltage induced at the surface of the wafer.

12. The method of claim 11 further comprising calculating a carrier lifetime from the measured surface photovoltage.

13. The method of claim 11 further comprising determining a conductivity type from the measured surface photovoltage.

14. The method of claim 11 further comprising determining a doping concentration from the measured surface photovoltage.

15. A method of treating a semiconductor wafer to reduce the affect of an ambient environment in which the wafer is exposed between processing steps, the method comprising:

providing a wafer having at least one of volatile and non-volatile contaminant ions and molecules adsorbed on a surface of the wafer as a result of being previously exposed to the ambient environment between processing steps;

creating a plurality of electron-hole pairs near the surface of the wafer under ambient pressure and atmosphere to weaken a strength with which the non-volatile ions and molecules are adsorbed on the surface of the wafer; and heating the wafer under ambient pressure and atmosphere to substantially desorb the non-volatile and the volatile ions and molecules adsorbed on the surface of the wafer.

* * * * *